(12) United States Patent
Burca et al.

(10) Patent No.: US 7,598,462 B2
(45) Date of Patent: Oct. 6, 2009

(54) SEALED REMOTE KEYLESS ENTRY DEVICE

(75) Inventors: John Burca, Rochester Hills, MI (US); Frank Buccinna, Livonia, MI (US)

(73) Assignee: Lear Corporation, Southfield, MI (US)

( * ) Notice: Subject to any disclaimer, the term of this patent is extended or adjusted under 35 U.S.C. 154(b) by 384 days.

(21) Appl. No.: 11/329,585

(22) Filed: Jan. 11, 2006

(65) Prior Publication Data

US 2007/0158094 A1    Jul. 12, 2007

(51) Int. Cl.
*H01L 23/02* (2006.01)
*H05K 5/06* (2006.01)

(52) U.S. Cl. ..................... 174/564; 174/560

(58) Field of Classification Search .......... 174/560, 174/561, 563, 564

See application file for complete search history.

(56) References Cited

U.S. PATENT DOCUMENTS

| | | | |
|---|---|---|---|
| 4,158,757 A * | 6/1979 | Reichert et al. | ......... 200/302.1 |
| 4,560,083 A | 12/1985 | Danico | |
| 4,636,593 A | 1/1987 | Novak et al. | |
| 5,140,108 A * | 8/1992 | Miyajima | ................... 174/563 |
| 5,317,462 A * | 5/1994 | Kakizaki et al. | ......... 360/97.02 |
| 6,016,676 A | 1/2000 | McConnell | |
| 6,621,446 B1 | 9/2003 | Chaillie | |
| 6,852,929 B2 | 2/2005 | Scudder | |
| 2002/0112870 A1* | 8/2002 | Kobayashi et al. | ............ 174/50 |
| 2004/0085251 A1 | 5/2004 | Shimura | |
| 2004/0099430 A1 | 5/2004 | Scudder | |
| 2004/0201512 A1 | 10/2004 | Sugimoto et al. | |

* cited by examiner

*Primary Examiner*—Hung V Ngo
(74) *Attorney, Agent, or Firm*—MacMillan, Sobanski & Todd, LLC

(57) ABSTRACT

A keyless entry device includes a rear casing having a first surface extending along a periphery of the rear casing member, an electronic circuit located in the rear casing member and including comprising a substrate and switching elements supported on the substrate, a front casing including a second surface facing the first surface and extending along a periphery of the rear casing member having button apertures aligned with a switching element. A seal element of compressible elastic material includes a peripheral flange comprising multiple protrusions located between the first surface and the second surface, the protrusions producing elastic preloaded contact between the front and rear casing members when the device is assembled, and pedestals aligned with a button aperture and a switching element. Button caps are aligned with a button aperture and located above one of the pedestals.

16 Claims, 3 Drawing Sheets

US 7,598,462 B2

SEALED REMOTE KEYLESS ENTRY DEVICE

BACKGROUND OF THE INVENTION

The present invention relates generally to an automotive remote keyless entry device housing and elastomer seal assembly and more specifically to an automotive remote keyless entry device assembly with improved seal integrity and improved assembly durability.

Wireless remote control units for use with motor vehicles are well known in the art. One typical type of system includes a remote keyless entry system for remotely locking and unlocking doors and performing other functions. The wireless communication system comprises a vehicle-mounted receiver and a portable key fob carried by the user. The key fob contains various push buttons for initiating the transmission of particular remote control commands (e.g., lock doors, unlock doors, unlock trunk, or initiate panic alarm).

Key fobs are being increasing deployed for applications using two-way communication between the key fob and the vehicle. Two-way communication is utilized, for example, in car locator systems wherein the two-way exchange of signals between the key fob and the receiver assist the holder of the key fob in finding their vehicle in a parking lot.

Key fobs are becoming increasingly sophisticated as more and more features are remotely-controlled and as additional types of information are conveyed to the key fob user. The use of sensitive electronic components in the key fobs intensifies the need for environmental protection (e.g., from moisture intrusion) and shock protection (e.g., from banging or dropping). For ease of carrying, a small size for the key fob needs to be achieved. Even though switch packaging space in the key fob is limited, it is desirable to maintain a satisfying tactile feel of the buttons and to minimize the possibility of inadvertent button activations. Even while achieving all the foregoing objects, the key fob needs to be economically mass-produced.

The portable transmitters commonly operate through the use of radio frequency transmitters positioned within tiny hand-held devices. Often these transmitters are carried by a person in a key fob, or other miniature container. The device must function consistently throughout extended periods of operation. It must be robust such then when subjected to a wide variety of punishing environments it remains operational. This typically includes sealing the transmitter, electronics, and battery supply within the transmitter casing.

Current sealing arrangements attempt to prevent moisture from damaging the internal components of the transmitter, but they often present considerable challenges when exposed to punishing environments. Assemblies are often dropped, impacted, or jarred and must retain their design benefits after exposure to these effects. Often seal designs, however, exert forces on the housing counter to the snap retaining mechanisms. This can result in disengagement of the housing assembly as a result of such impacts or if the housing sections are not completely engaged. Furthermore, misalignment of the seal during assembly can exacerbate the forces on the housing sections making assembly virtually impossible without disassembly and realignment of the seal. Considerable time and effort is often exhausted during assembly of remote keyless transmitters due to design characteristics and alignment of the seal element.

It would therefore be highly desirable to have an automotive remote keyless entry device with an improved elastomer seal design such that assembly integrity is improved. It would further be highly desirable to develop an automotive keyless entry device wherein proper alignment of the elastomer seal during assembly could be insured such that the time and effort required to assemble the device housing is minimized.

SUMMARY OF THE INVENTION

A keyless entry device, according to this invention, includes a rear casing having a first surface extending along a periphery of the rear casing member, an electronic circuit located in the rear casing member and including comprising a substrate and switching elements supported on the substrate, a front casing including a second surface facing the first surface and extending along a periphery of the rear casing member having button apertures aligned with a switching element. A seal element of compressible elastic material includes a peripheral flange comprising multiple protrusions located between the first surface and the second surface, the protrusions producing elastic preloaded contact between the front and rear casing members when the device is assembled, and pedestals aligned with a button aperture and a switching element. Button caps are aligned with a button aperture and located above one of the pedestals. A button cap can be depressed toward the substrate to actuate a respective one of the switching elements.

The present invention has the advantage of sealing electronic components within a key fob using a corrugated seal that produces improved sealing of a keyless entry device particularly of the type used in the automotive field. The invention produces the further advantages of a small package size and a low cost assembly. A high quality tactile feel of pushbutton switches is achieved and inadvertent button activation is minimized.

Other features and advantages of the present invention will become apparent when viewed in light of the detailed description and preferred embodiment when taken in conjunction with the attached drawings and claims.

DESCRIPTION OF THE PREFERRED EMBODIMENT

Figure 1:
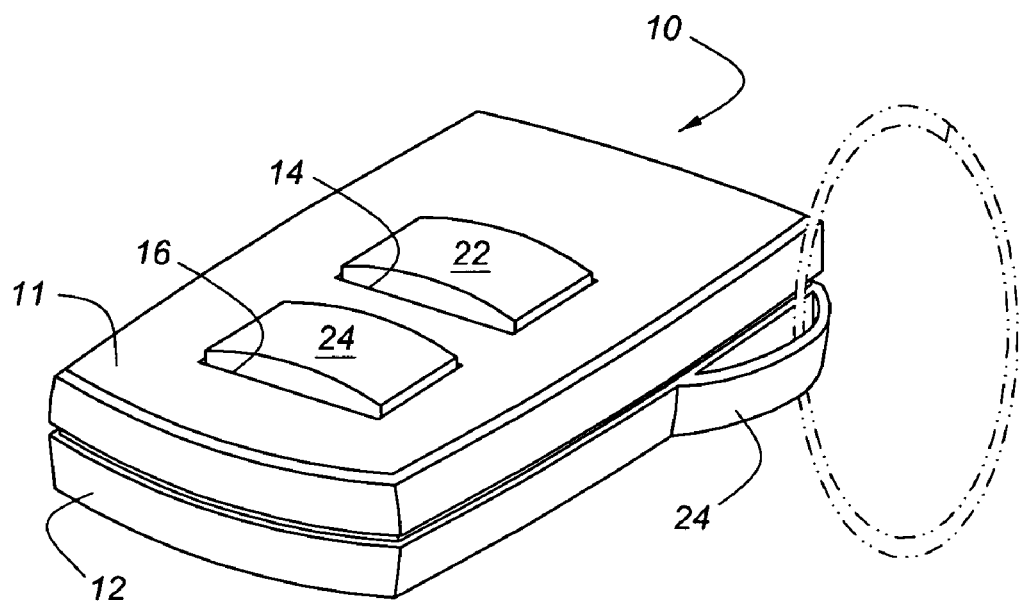
FIG. 1 is a perspective view of the keyless entry device of the present invention.
Figure 2:
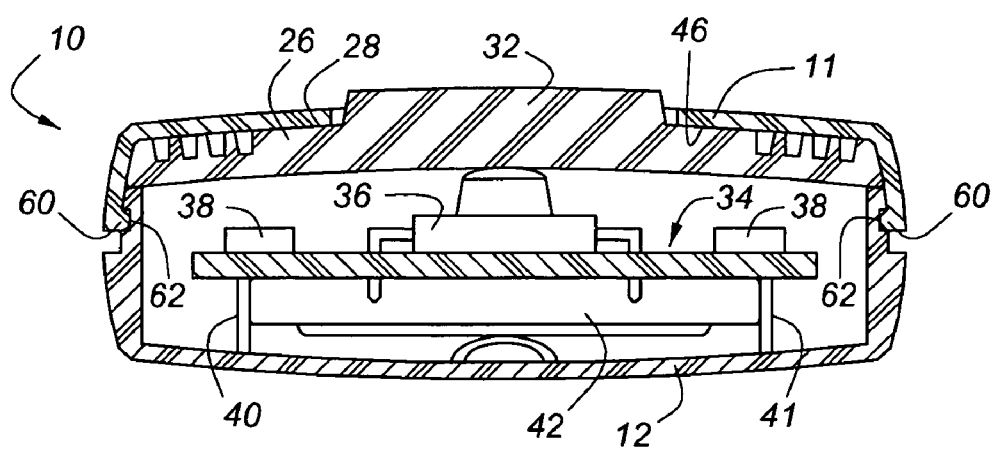
FIG. 2 is a transverse cross sectional view of the keyless entry device.

Referring now to FIGS. 1 and 2, the remote keyless entry device (RKE) or RKE device 10 includes a front casing member 11 and a rear casing member 12 enclosing RKE device electronics. Front casing member 11 includes a plurality of button apertures 14, 16 for receiving button caps 20, 22, respectively. The button caps 20, 22 may be imprinted with graphic symbols to identify various commands to be transmitted to the vehicle or for adjusting functions within the RKE device 10. Front and rear casing members 11, 12 cooperatively form a key ring passage 24. An elastomeric seal member 26 is located between the front and rear casing members 11, 12. Preferably, seal member 26 does not extend into the key ring passage 24.

Figure 3:
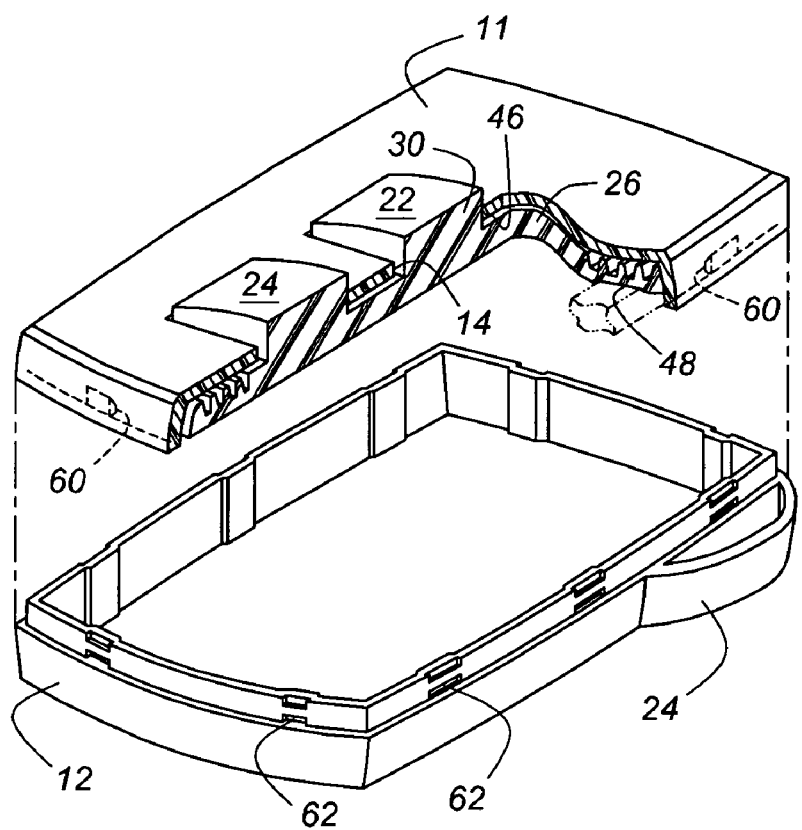
FIG. 3 is a perspective view partially in cross section of the keyless entry device.

FIGS. 2 and 3 show RKE device 10 in cross section to reveal the seal member 26 in greater detail. The seal member 26, which is preferably formed of compression-molded silicone and molded integrally as a unit, includes a plurality of pedestals that extend locally from the surface 28 of the seal, an upper pedestal 30 located under button cap 22 and a lower pedestal 32-33 located under button cap 24. As shown in FIG. 2, rear casing member 12 receives an electronic circuit board 34 comprising a circuit board 35 for supporting a plurality of switching elements 36, each switching element aligned with a respective pedestal 30, 32. Also mounted on the front side of the printed circuit board 34 is an integrated circuit 38, which may comprise a remote keyless entry (RKE) transceiver fabricated as an application specific integrated circuit (ASIC). Rear casing member 12 preferably includes a receptacle and/or circuit board alignment posts 40, 41 for interfacing with circuit board 34 to retain it in a predetermined position. An electric battery 42, for providing power to the circuit 34, is secured to the back surface of the PCB 34.

Pedestals 30, 32 project frontward locally from the surface 28 of elastomeric seal member 26. The button caps 22, 24 are preferably fabricated from a rigid plastic material and may be bonded to the pedestals by a suitable adhesive. The button caps 22, 24 and pedestals 30, 32 are received within the respective apertures 14, 16 and move longitudinally within the apertures guide walls. Preferably, the height of the pedestals together with the height of the button caps results in the button caps protruding slightly above the outer surface of front casing member 11 when they are not being actuated.

When either of the button caps 22, 24 is manually depressed rearward by a user, the respective switching element 36 is actuated due to the force that is transmitted through the pedestal to the switching element from the button cap. When the force that depresses the button cap 22, 24 is released, spring forces produced by the switching element and/or an elastic force stored in the pedestal 30, 32 by the manual application of the button urge the button cap rearward and restore the button cap and its pedestal to their original positions.

Figure 4:
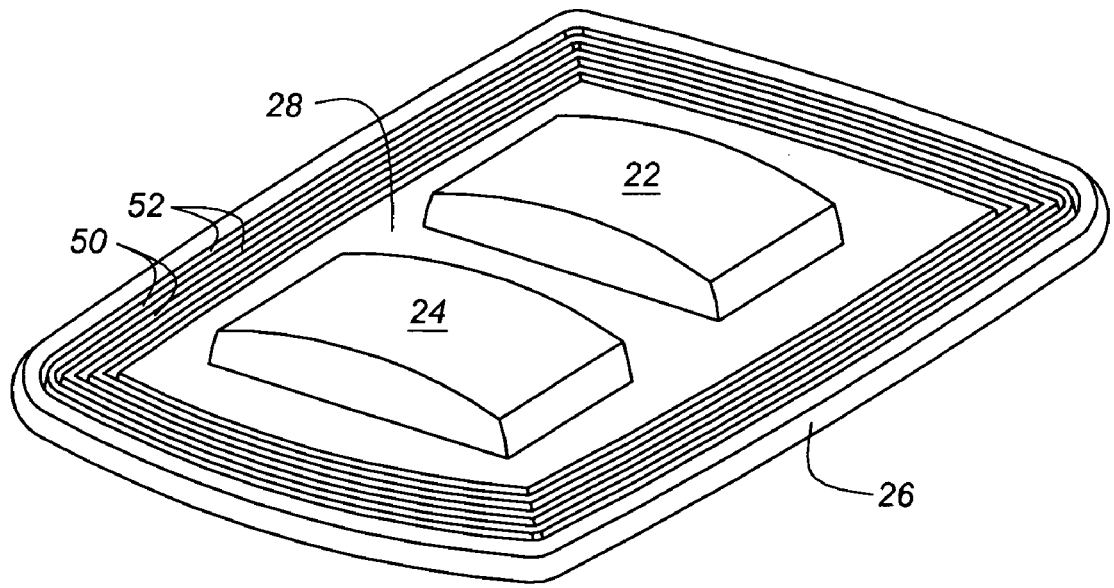
FIG. 4 is a perspective view of the elastomeric seal member.
Figure 5:
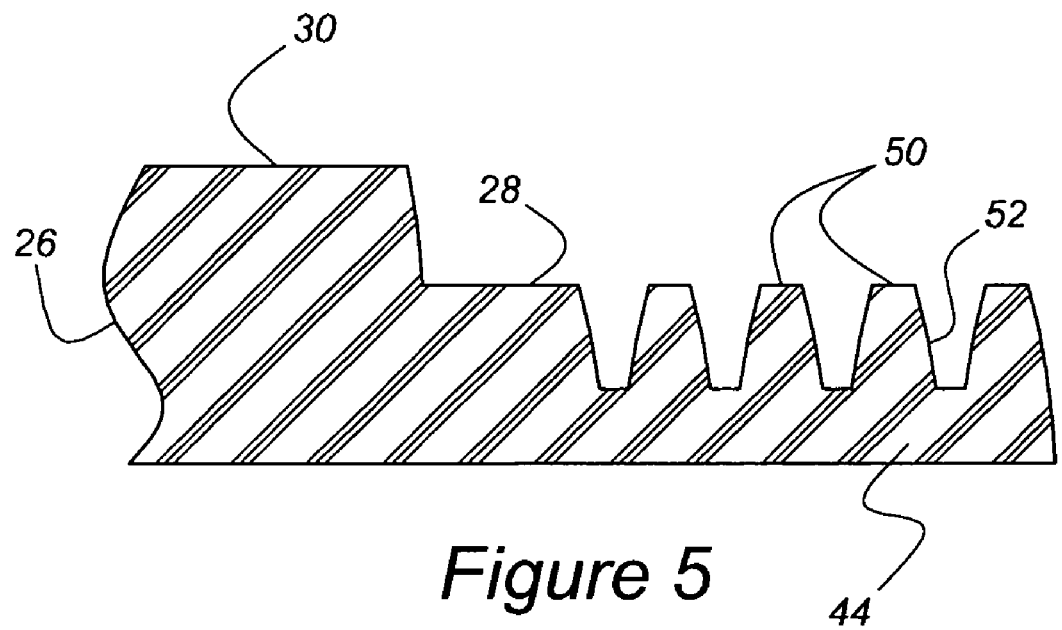
FIG. 5 is a partial cross-sectional view of the elastomeric seal member in the vicinity of a peripheral flange.

As shown in FIGS. 4 and 5, the surface 28 of elastomeric seal member 26 includes a peripheral flange 44 that encircles the seal and is fitted between the inner surface 46 of the front casing member 11 and an interior surface 48 of the rear casing member 12. Flange 44 is formed with a plurality of protrusions 50, which are each directed forward toward the front casing member 11 from the base surface of the seal 26, and laterally spaced recesses 52, each recess located between a protrusion. The lateral pitch of the protrusions 50 may be about 0.80 mm. the thickness of the flange 44 below the protrusions may be about 0.50 mm. and the height of the protrusions may be about 1.00-1.50 mm.

Figure 6:
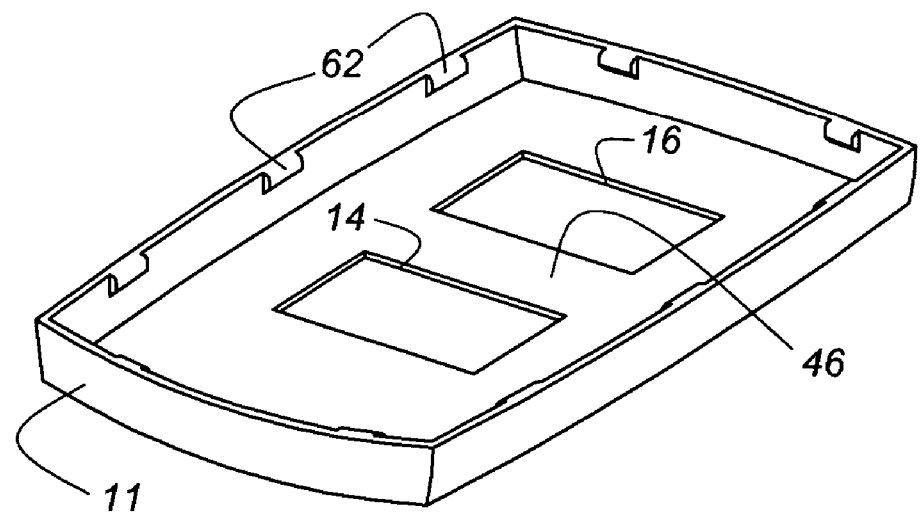
FIG. 6 is a perspective view of the inner surface of the front casing member.

To secure the front casing member 11 and rear casing member 12 of the RKE device 10 together as one unit, localized latch components are spaced around the periphery of the rear and front casing members. As FIG. 6 illustrates, a plurality of spaced, elastically displaceable locking tabs 60 on front rear casing member 11 engage detents 62 spaced along the periphery of rear casing member 12. In order to change the battery and to access the PCB 34, the device 10 is opened by disengaging the tabs 60 from the detents 62 and separating the front and rear casing members 11 and 12.

Surface 48 of the rear casing member 12 provides a surface onto which the elastomeric seal member 26 is placed immediately below the flange 44 and the protrusions 50 and recesses 52. The front casing member 11 and rear casing member 12 are aligned at their peripheries and then forced together to close the fob 10 by latching the tabs 60 onto the detents 62. As this occurs, the protrusions 50 of the sealing element 26 between surfaces 46 and 48, thereby produce a sealed cavity within the fob 10, the seal preventing environmental contaminants and water from entering the cavity containing the electronic components of the RKE device. In addition, the seal provides a shock absorber to protect the electronic circuit board 34 from impact if the RKE device 10 is dropped.

In order to provide a stiffer button action that better resists inadvertent actuation, the switching elements 36 used on circuit board may be tact switches instead of dome switches. A tact switch (such as an SKQG Series Tact switch having an actuation force of 3.43 N from ALPS Electric Company, Ltd.) is a miniature switch with a click-type tactile feedback, which requires a somewhat greater force to activate than a dome switch. The height of the button caps 22, 24 and pedestals 30, 32 can be established such that they result in a flush arrangement with the outer surface of the case member 11 by avoiding false, inadvertent activation of the switches.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. A keyless entry device comprising:
   a rear casing member including a first surface extending along a periphery of the rear casing member;
   an electronic circuit located in the rear casing member, comprising a substrate and switching elements supported on the substrate;
   a front casing member including a second surface facing the first surface and extending along a periphery of the rear casing member, and having button apertures, each aperture aligned with and located above a switching element;
   a seal element of compressible elastic material, including a peripheral flange comprising a seal surface, multiple protrusions located between the first surface and the second surface and extending from the flange to an elevation of the seal surface, the protrusions producing elastic preloaded contact between the front and rear casing members when the device is assembled, and pedestals extending from the flange to an elevation greater than the elevation of the of the seal surface, each pedestal aligned with a button aperture and a switching element; and
   button caps, each cap aligned with a button aperture and located above one of the pedestals, whereby a button cap can be depressed toward the substrate to actuate a respective one of the switching elements.

2. The device of claim 1 wherein the seal element is formed of elastomer.

3. The device of claim 1 further comprising:
   pairs of latch elements spaced around a periphery of the front and rear casing members, a first member of each pair secured to the rear casing member and a second member of each pair secured to the rear casing member and engageable with the first member, for releasably securing the rear casing member and front casing member together and maintaining the protrusions in a compressed condition between the casing members when the device is assembled and latch elements are mutually engaged.

4. The device of claim 1 wherein the peripheral flange of the seal element further comprises:
  protrusions spaced laterally across a width of the flange and extending along a length of the flange around a periphery of the device, each protrusion laterally spaced from an adjacent protrusion by a recess that extends along a length of the flange.

5. The device of claim 1 wherein the peripheral flange of the seal element further comprises:
  protrusions spaced laterally across a width of the flange and extending along a length of the flange, each protrusion having a crest located at a greater distance above the first surface than a distance between the first surface and the second surface when the device is closed and rear casing is secured to the front casing.

6. The device of claim 1 wherein the latch elements include:
  multiple detents spaced mutually along a periphery of one of the rear casing member and the front casing member; and
  multiple tabs spaced mutually along a periphery of the other of the rear casing member and the front casing member, each tab aligned with a detent and elastically displaceable into and out of engagement with the detent, for securing and releasing the front and rear casing members together.

7. The assembly of claim 1 wherein said electronic circuit comprises a remote keyless entry transmitter.

8. The assembly of claim 1 wherein one of the rear casing member and the front casing member is formed integrally with a key ring passage.

9. A keyless entry device comprising:
  a rear casing member including a first surface extending along a periphery of the rear casing member;
  an electronic circuit located in the rear casing member, comprising a substrate and switching elements supported on the substrate;
  a front casing member including a second surface facing the first surface and extending along a periphery of the rear casing member, and having button apertures, each aperture aligned with and located above a switching element;
  a seal element of compressible elastic material including a peripheral flange comprising a seal surface, multiple protrusions located between the first surface and the second surface and extending from the flange to an elevation of the seal surface, the protrusions being spaced laterally across a width of the flange and extending along a length of the flange, each protrusion having a crest located at a greater distance above the first surface than a distance between the first surface and the second surface when the rear casing is secured to the front casing, and pedestals extending from the flange to an elevation greater than the elevation of the of the seal surface, each pedestal aligned with a button aperture and a switching element; and
  button caps, each cap aligned with a button aperture and located above one of the pedestals, whereby a button cap can be depressed toward the substrate to actuate a respective one of the switching elements and the protrusions are fitted with form are loaded seal.

10. The device of claim 9 further comprising:
  pairs of latch elements spaced around a periphery of the front and rear casing members, a first member of each pair secured to the rear casing member and a second member of each pair secured to the rear casing member and engageable with the first member, for releasably securing the rear casing member and front casing member together and maintaining the protrusions in a compressed condition between the casing members when the device is assembled and latch elements are mutually engaged.

11. The device of claim 9 wherein the peripheral flange of the seal element further comprises:
  protrusions spaced laterally across a width of the flange and extending along a length of the flange around a periphery of the device, each protrusion laterally spaced from an adjacent protrusion by a recess that extends along a length of the flange.

12. The device of claim 9 wherein the latch elements include:
  multiple detents spaced mutually along a periphery of one of the rear casing member and the front casing member; and
  multiple tabs spaced mutually along a periphery of the other of the rear casing member and the front casing member, each tab aligned with a detent and elastically displaceable into and out of engagement with the detent, for securing and releasing the front and rear casing members together.

13. The assembly of claim 9 wherein said electronic circuit comprises a remote keyless entry transmitter.

14. The assembly of claim 9 wherein one of the rear casing member and the front casing member is formed integrally with a key ring passage.

15. A seal for a keyless entry device having a rear casing member including a first surface and a front casing member including a second surface facing the first surface, and having button apertures, each aperture aligned with and located above a switching element, and an electronic circuit located in the rear casing member and comprising a substrate and switching elements supported on the substrate, comprising:
  a seal element formed of compressible elastic material, including a flange comprising a seal surface, multiple protrusions located between the first surface and the second surface and extending from the flange to an elevation of the seal surface, the protrusions producing elastic preloaded contact between the front and rear casing members when the device is assembled, and pedestals extending from the flange to an elevation greater than the elevation of the of the seal surface, each pedestal aligned with a button aperture and a switching element.

16. The seal of claim 15 wherein protrusions are spaced laterally across a width of the flange and extending along a periphery of the flange, each protrusion having a crest located at a greater distance above the first surface than a distance between the first surface and the second surface when the device is closed and the rear casing is secured to the front casing.

* * * * *

UNITED STATES PATENT AND TRADEMARK OFFICE
CERTIFICATE OF CORRECTION

PATENT NO. : 7,598,462 B2  Page 1 of 1
APPLICATION NO. : 11/329585
DATED : October 6, 2009
INVENTOR(S) : Burca et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 492 days.

Signed and Sealed this

Twenty-eighth Day of September, 2010

David J. Kappos
*Director of the United States Patent and Trademark Office*